US006781854B2

(12) United States Patent
Dutarde et al.

(10) Patent No.: US 6,781,854 B2
(45) Date of Patent: Aug. 24, 2004

(54) MATRIX CONVERTER FOR TRANSFORMING ELECTRICAL ENERGY

(75) Inventors: Emmanuel Dutarde, Mirepeix (FR); Christophe Beuille, Aureilhan (FR); Fabrice Breit, Campan (FR); Henri Schneider, Toulouse (FR)

(73) Assignee: Alstom, Paris (FR)

( * ) Notice: Subject to any disclaimer, the term of this patent is extended or adjusted under 35 U.S.C. 154(b) by 95 days.

(21) Appl. No.: 10/340,724

(22) Filed: Jan. 13, 2003

(65) Prior Publication Data

US 2003/0156432 A1 Aug. 21, 2003

(30) Foreign Application Priority Data

Jan. 17, 2002 (FR) .............................................. 02 00552

(51) Int. Cl.[7] .............................................. H02M 5/06
(52) U.S. Cl. .......................... 363/37; 363/127; 363/152
(58) Field of Search ........................... 363/37, 127, 15, 363/2

(56) References Cited

U.S. PATENT DOCUMENTS

2001/0026427 A1   10/2001   Mahlein et al.

FOREIGN PATENT DOCUMENTS

WO   WO 99 67798 A   12/1999

OTHER PUBLICATIONS

Prasad, R. R. et al., "Optically triggered diamond switches", Digest of Technical Papers, 12th IEEE International Pulsed Power Conference, (CAT. No. 99CH36358), Proceedings of the 12th International Pulsed Power Conference, Monterey, CA USA, Jun. 27–30, 1999, pp. 142–145, vol. 1. XP002223450, 1999, Piscataway, NJ, USA, IEEE.

Krishnan, M. et al, "Fast opening diamond switch for high voltage, high average power inductive energy store modulators", Digest of Technical Papers, 12th IEEE International Pulsed Power Conference, (CAT. No. 99CH36358), Proceedings Of The 12th International Pulsed Power Conference, Monterey, CA, USA, Jun. 27–30, 1999, pp. 1222–1225, vol. 2, XP002223451, 1999, Piscataway, NJ, USA, IEEE.

Primary Examiner—Fetsum Abraham
(74) Attorney, Agent, or Firm—Sughrue Mion, PLLC

(57) ABSTRACT

A matrix converter for transforming electrical energy between at least one voltage source, in particular a power supply network, and at least one current source, in particular a load, said converter including a matrix of switches connecting said voltage sources to said current sources, wherein each of said switches has two terminals disposed in respective distinct parallel planes and a photoconductive diamond substrate interposed between said two terminals of the switch, each switch being controlled by means of a light source irradiating the diamond substrate interposed between the two terminals.

9 Claims, 4 Drawing Sheets

US 6,781,854 B2

MATRIX CONVERTER FOR TRANSFORMING ELECTRICAL ENERGY

The invention relates to a matrix converter for transforming electrical energy between a voltage source, such as a power supply network, and a current source, such as a motor. The invention is particularly applicable to controlling traction motors in the field of railways.

BACKGROUND OF THE INVENTION

U.S. patent application Ser. No. 2001/0026427 A1 discloses a matrix converter comprising a 3×3 matrix made up of both-way switches for powering an asynchronous motor from a three-phase network. By means of its modular topology, such a matrix converter offers the advantage of making it possible for a given alternating current (AC) to be converted directly into AC at a different voltage and at a different frequency by appropriately controlling the various switches, unlike the fixed-structure converters that are usually used and which require an AC-to-DC rectifier, a DC-to-DC chopper, and a DC-to-AC uninterruptible power supply (UPS) to be associated in series and to be combined with filter capacitors in order to obtain the same result.

However, in such a matrix converter, the both-way switches are constituted by associating diodes and Integrated Gate Bipolar Transistor (IGBT) components, which suffer from the drawback of not being capable of withstanding high voltages, since the most robust IGBT components that are currently commercially available are limited to an operating voltage of about 6.5 kV. In addition, such an IGBT component suffers from the drawback of having a control gate that must be isolated from its collector and from its emitter, which poses problems when the voltage across the terminals of the IGBT component becomes high.

OBJECTS AND SUMMARY OF THE INVENTION

Therefore, an object of the present invention is to provide a matrix converter of a novel type that can operate at high voltages while remaining very compact. Another object of the invention is to provide a matrix converter in which switch control is naturally isolated from the terminals of said switches.

To this end, the invention provides a matrix converter for transforming electrical energy between at least one voltage source, in particular a power supply network, and at least one current source, in particular a load, said converter including a matrix of switches connecting the voltage sources to the current sources, wherein each of the switches has two terminals disposed in respective distinct parallel planes and a photoconductive diamond substrate interposed between the two terminals of the switch, each switch being controlled by means of a light source irradiating the diamond substrate interposed between the two terminals.

In particular embodiments, the matrix converter of the invention may have one or more of the following characteristics taken in isolation or in any technically feasible combination:

- the diamond substrate is obtained by a chemical vapor deposition (CVD) method;
- the terminals are formed by metal-plating the diamond substrate by vapor deposition of titanium, platinum, and gold in succession;
- the light source is an ultraviolet source;
- for each switch, the light source is disposed facing one of the two terminals of the switch, said terminal being provided with at least one opening making it possible for the radiation from said source to pass through to the diamond substrate interposed between the two terminals;
- a single diamond substrate is interposed between all of the terminals of the matrix of switches;
- each switch of the converter is formed by an individual diamond substrate which is supported by a ceramic substrate, said individual diamond substrate being bonded to the supporting ceramic substrate via a layer of glass; and
- each switch has one terminal connected to a voltage source via a conductor track disposed on one face of the ceramic substrate, and one terminal connected to a current source via conductor tracks carried by the opposite face of the ceramic substrate.

BRIEF DESCRIPTION OF THE DRAWINGS

The objects, features, and advantages of the present invention will be better understood on reading the following description of two embodiments of the invention given by way of non-limiting example, with reference to the accompanying drawings, in which.

MORE DETAILED DESCRIPTION

Figure 1:
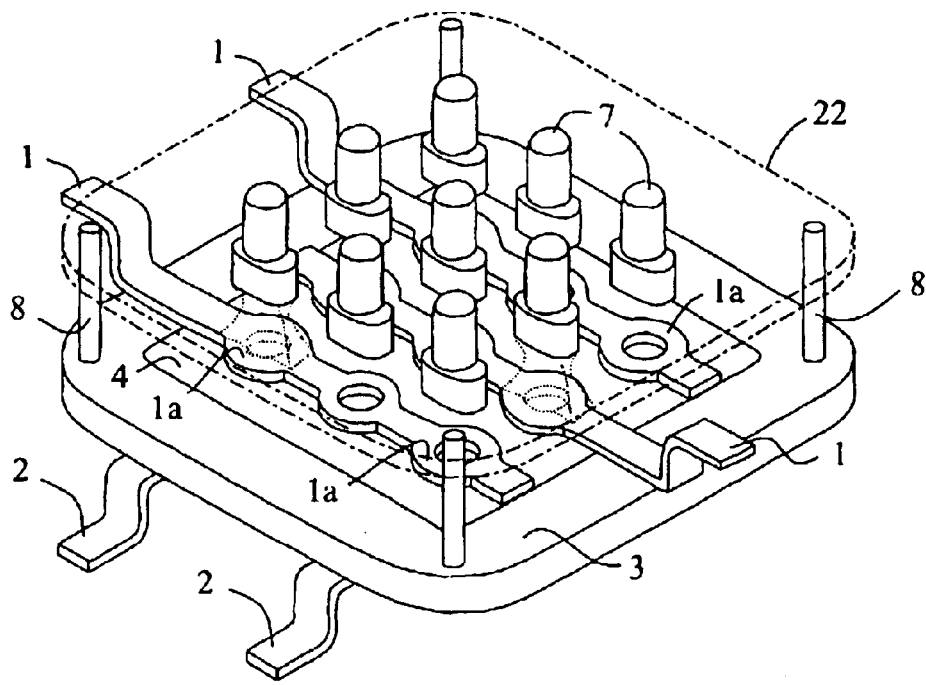
FIG. 1 is a perspective view of a matrix converter in a particular embodiment of the invention.

To make the drawing clearer, only those elements which are necessary to understand the invention are shown. Like elements are given like references from one figure to another. To improve the clarity of the drawings further, certain elements of the converter are shown in the detail views only.

FIG. 1 shows a particular embodiment of a matrix converter of the invention. This matrix converter has three inlet connectors 1, which, for example, are to be powered by a three-phase network, and three outlet connectors 2, which, for example, are to supply energy to an asynchronous motor.

As shown in this figure, the matrix converter includes a base 3 that is made of a plastics material, that is substantially square in shape, with sides of 150 millimeters (mm), and that is provided with an opening in its center, which opening opens out on both faces of the base 3, and receives a photoconductive diamond substrate 4. The diamond substrate 4 is made in a manner known per se by a chemical vapor deposition (CVD) method.

The diamond substrate 4 has a top face which is in contact with three inlet connectors 1, which connectors are constituted by respective conductor bars disposed in parallel. Each inlet connector 1 is generally rectilinear in shape facing the diamond substrate 4, and it is provided locally with three annular portions 1a disposed so that the annular portions 1a of the three inlet connectors 1 are arranged in a 3×3 matrix pattern.

Figure 2:
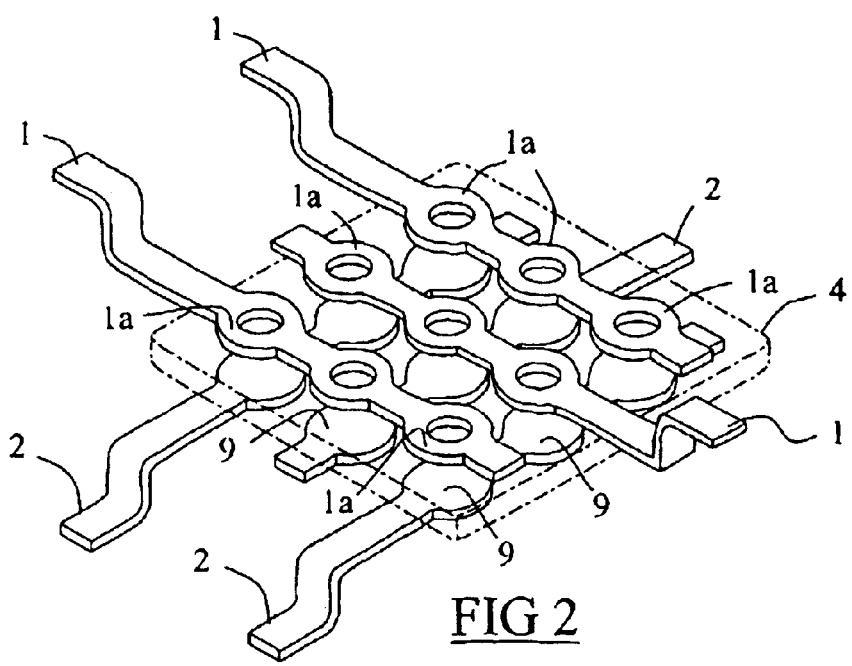
FIG. 2 is a simplified perspective view of the converter of FIG. 1, showing how the inlet connectors and the outlet connectors are assembled on the diamond substrate.

As shown in FIG. 2, in which only the inlet connectors 1, the outlet connectors 2, and the diamond substrate 4 are shown, the bottom face of the diamond substrate 4 is in contact with the three outlet connectors 2 constituted by respective conductor bars disposed in parallel and angularly positioned perpendicularly to the three inlet connectors 1. Each outlet connector 2 is generally rectilinear in shape facing the diamond substrate 4, and is provided locally with three disk-shaped bulges 9 disposed so that each of the disks 9 is in register with a respective annular portion 1a of an inlet connector 1 disposed on the opposite face of the diamond substrate 4, which is shown in chain-dotted lines in FIG. 2.

Figure 3:
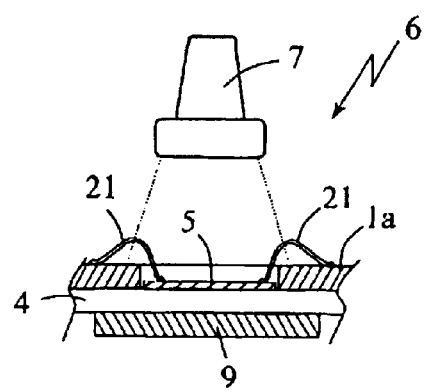
FIG. 3 is a detail view in section of a diamond switch equipping the converter of FIG. 1.
Figure 4:
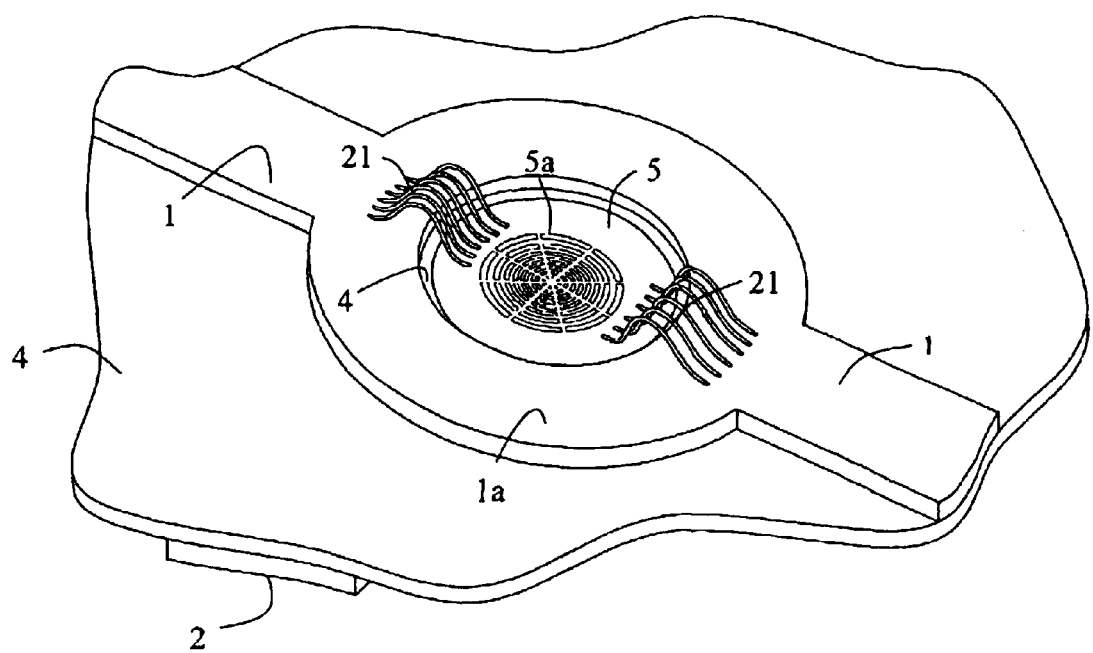
FIG. 4 is a detail view in perspective of the switch of FIG. 3.

FIGS. 3 and 4 show in more detail the make-up of a diamond switch 6 equipping the matrix converter. As shown in these figures, each annular portion 1a is provided in its center with an opening at which the top face of the diamond substrate 4 is covered with a metal-plated terminal 5 which is shown in these figures only. The metal-plated terminal 5 is connected electrically to the inlet connector 1 via aluminum wires 21 bonded to the adjacent annular portion 1a, the terminal 5 and the disk 9 disposed in register therewith on the opposite face of the diamond substrate 4 constituting the two terminals of the diamond switch 6.

For example, such metal-plated terminals 5 may be obtained on the diamond substrate 4 by a metal-plating method comprising the following steps:

depositing a photosensitive resin on the top face of the diamond substrate;

removing the resin from the areas to be metal-plated by exposing them to radiation through a mask;

metal-plating by vapor deposition of titanium, platinum, and gold in succession on the surface of the diamond substrate as covered in part with resin; and removing the remaining resin by dipping the diamond substrate in acetone.

Electrical conduction between the two terminals 5 and 9 is obtained on command by switching on an ultraviolet light source 7 disposed facing the terminal 5, which is provided with multiple non-metal-plated slots 5a that are circular arc shaped and that allow the radiation emitted by the light source 7 to pass through them in order to irradiate the volume of diamond 4 between the terminals 5 and 9 of the diamond switch 6, thereby causing electricity to be conducted between said two terminals. The light sources 7 are advantageously supported by a plate 22, shown in chain-dotted lines in FIG. 1, and mounted on legs 8 carried by the top face of the base 3, and they are controlled independently from one another by a control circuit constituting the control circuit of the converter.

Such a matrix converter offers the advantage of having diamond switches that can withstand high voltages across their terminals, and that naturally enable electricity to flow in either direction through the converter. In addition, such a converter is controlled by optically controlling the diamond switches, such control offering the advantage of being naturally isolated from the electrical potential across the terminals of the switch. Finally, since its topology is made modular by means of the optical control, such a matrix converter makes any type of conversion possible, such as single-phase or three-phase direct AC-to-AC conversion, AC-to-DC conversion, or DC-to-DC conversion when it is connected to a DC voltage source.

Figure 5:
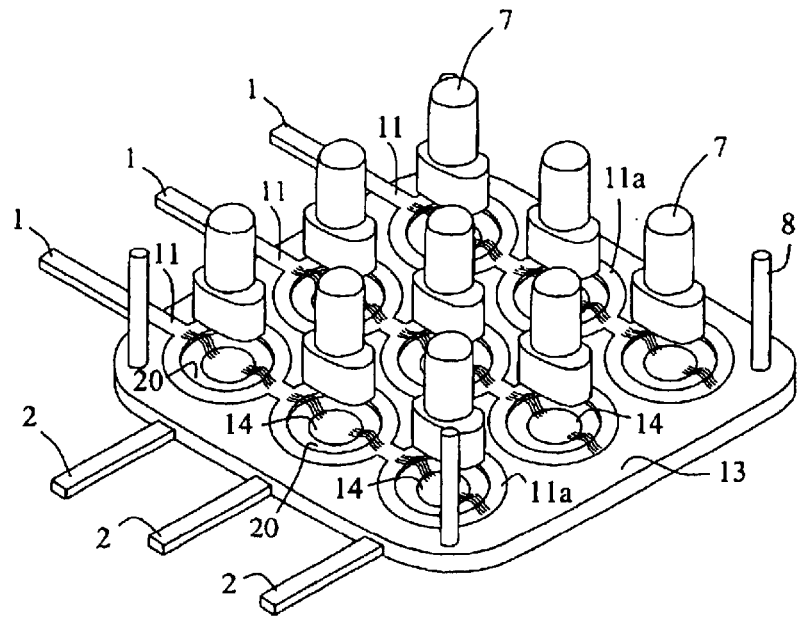
FIG. 5 is a perspective view of the top face of a matrix converter in a variant embodiment of the converter of the invention.
Figure 6:
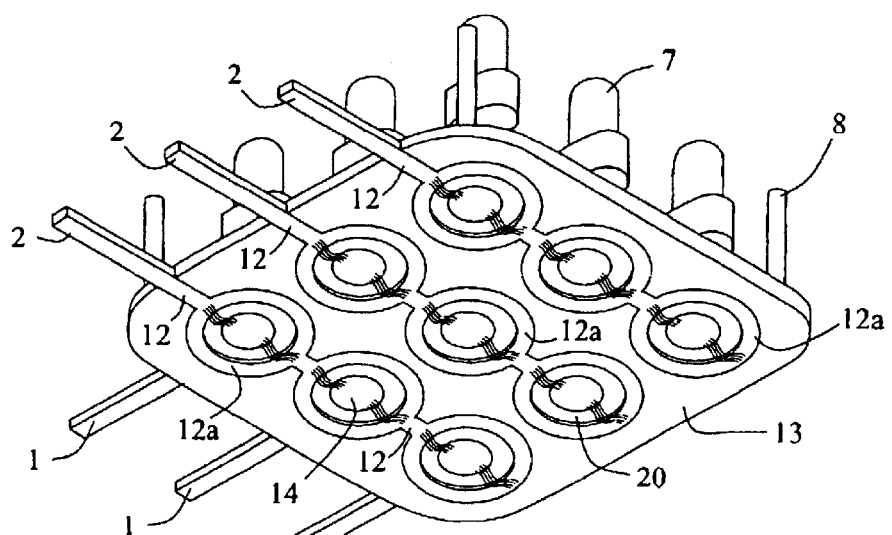
FIG. 6 is a perspective view of the bottom face of the converter of FIG. 5.

FIGS. 5 to 8 show a variant embodiment of the converter of the invention, corresponding to a preferred embodiment. As shown in FIGS. 5 and 6, the matrix converter includes a ceramic substrate 13 made of aluminum nitride (AlN) and provided with nine circular holes distributed in a 3×3 matrix pattern, each hole opening out on either side of the ceramic substrate 13 and receiving a cylindrical diamond substrate 14, of diameter of about 10 mm, surrounded by a glass zone 20.

The glass zone 20, optionally filled with ceramic, forms an interface between the diamond substrate 14 and the ceramic substrate 13, and offers the advantage of having an expansion coefficient α close to 3.5, making it possible to attenuate the forces caused by the differential expansion between the diamond (α=1) and the AlN substrate (α=4.5).

As shown in FIG. 5, the top face of the ceramic substrate 13 is provided with three inlet connectors 1 projecting from one edge of the ceramic substrate 13 and being extended on the substrate 13 by respective conductor tracks 11 disposed in parallel, each conductor track 11 being aligned with a row of the 3×3 matrix of diamond substrates 14. Each of the conductor tracks 11 includes three annular portions 11a extending at the peripheries of respective ones of the three diamond substrates 14 aligned with the inlet connector 1 in question.

As shown in FIG. 6, the bottom face of the ceramic substrate 13 is provided with three outlet connectors 2 angularly positioned perpendicularly to the inlet connectors 1 and projecting from one edge of the ceramic substrate 13. The three outlet connectors 2 are extended on the substrate 13 by respective conductor tracks 12 disposed in parallel, each track 12 being aligned with a column of the 3×3 matrix made up of diamond substrates 14. Each of the conductor tracks of the outlet connectors 2 includes three annular portions 12a extending at the peripheries of respective ones of the three diamond substrates 14 aligned with the outlet connector 2 in question.

Figure 7:
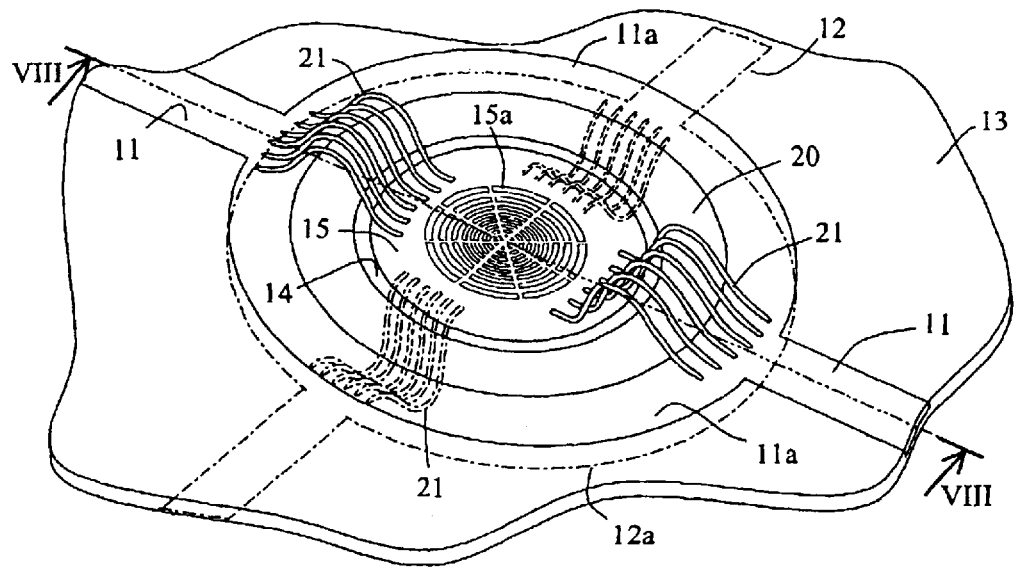
FIG. 7 is a detail view in perspective of a diamond switch of the converter of FIGS. 5 and 6.
Figure 8:
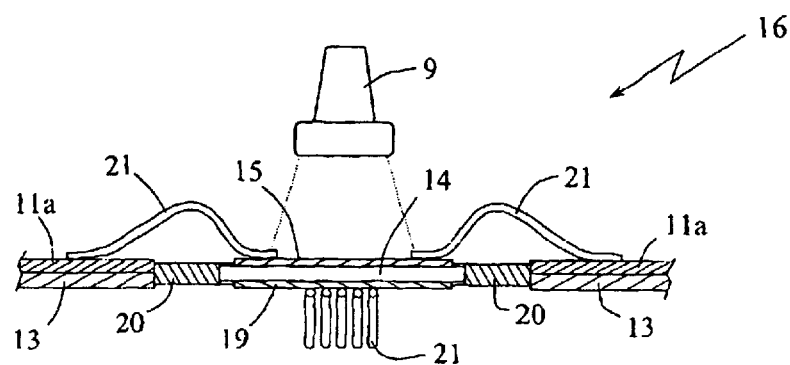
FIG. 8 is a detail view in section on line VIII—VIII of the switch of FIG. 7.

As shown in FIGS. 7 and 8, each diamond substrate 14 has a top face and a bottom face covered over substantially their entire surfaces by respective metal-plated terminals 15 and 19, the top terminal 15 and the bottom terminal 19 (shown in these figures only) constituting the two terminals of a diamond switch 16. For example, such metal-plated terminals 15 and 19 may be obtained on the diamond substrate 14 by a metal-plating method comprising the following steps:

depositing a photosensitive resin on the top face of the diamond substrate;

removing the resin from the areas to be metal-plated by exposing them to radiation through a mask;

metal-plating by vapor deposition of titanium, platinum, and gold in succession on the surface of the diamond substrate as covered in part with resin; and removing the remaining resin by dipping the diamond substrate in acetone.

The top terminal 15 of each diamond substrate 14 is connected via aluminum wires 21 to the annular portion 11a of the conductor track 11 disposed at the periphery of the diamond substrate 14, and the bottom terminal 19 of each diamond substrate 14 is connected via aluminum wires 21 (shown in chain-dotted lines in FIG. 7) to the annular portion 12a of the conductor track 12 disposed at the periphery of the diamond substrate 14.

With reference to FIG. 7, the center of the top terminal 15 of the diamond substrate is provided with multiple nonmetal-plated slots 15*a* that are circular arc shaped and that allow the ultraviolet radiation emitted by a light source 7 disposed facing the diamond substrate 14 to pass through in order to irradiate the volume of the diamond substrate 14 disposed between the top terminal 15 and the bottom terminal 19, thereby causing electricity to be conducted between the two terminals. The light sources 7 are advantageously supported by a plate (not shown in the figures) mounted on legs 8 carried by the top face of the base 13, the light sources 7 being controlled individually by a control circuit.

Such a variant embodiment offers the advantage of requiring a smaller area of diamond substrate than that required by the embodiment of FIG. 1, thereby making it possible to reduce the cost of manufacturing the converter.

Regardless of the variant embodiment of the invention, the thickness of the diamond substrate (e.g. made by a CVD method) is adapted to the operating voltage of the converter, and may, for example, vary from a thickness of 50 $\mu$m, for withstanding a voltage between the two faces of the diamond substrate of about 5 kV, to a thickness of 200 $\mu$m for withstanding a voltage of about 20 kV.

The converter of the invention may advantageously be used to control a traction motor for a rail vehicle using a catenary voltage, its modular topology enabling it to adapt to various types of catenary voltage merely by modifying its control of the diamond switches.

Naturally, the invention is in no way limited to the embodiment described and shown, which is given merely by way of example. Modifications remain possible, in particular concerning the make up of the various elements, or the use of equivalent substitute techniques, without going beyond the scope of protection of the invention.

What is claimed is:

1. A matrix converter for transforming electrical energy between at least one a voltage source, in particular a power supply network, and at least one current source, in particular a load, said converter including a matrix of switches connecting said voltage sources to said current sources, wherein each of said switches has two terminals disposed in respective distinct parallel planes and a photoconductive diamond substrate interposed between said two terminals of the switch, each switch being controlled by means of a light source irradiating the diamond substrate interposed between the two terminals.

2. A matrix converter according to claim 1, wherein said diamond substrate is obtained by a chemical vapor deposition method.

3. A matrix converter according to claim 2, wherein the terminals are formed by metal-plating the diamond substrate by vapor deposition of titanium, platinum, and gold in succession.

4. A matrix converter according to claim 1, wherein said light source is an ultraviolet source.

5. A matrix converter according to claim 1, wherein, for each switch, the light source is disposed facing one of the two terminals of the switch, said terminal being provided with at least one opening making it possible for the radiation from said source to pass through to the diamond substrate interposed between the two terminals.

6. A matrix converter according to claim 1, wherein a single diamond substrate is interposed between all of the terminals of the matrix of switches.

7. A matrix converter according to claim 1, wherein each switch of the converter is formed by an individual diamond substrate which is supported by a ceramic substrate, said individual diamond substrate being bonded to the supporting ceramic substrate via a layer of glass.

8. A matrix converter according to claim 7, wherein each switch has one terminal connected to a voltage source via a conductor track disposed on one face of the ceramic substrate, and one terminal connected to a current source via conductor tracks carried by the opposite face of said ceramic substrate.

9. A matrix converter according to claim 7, wherein said ceramic substrate is made of aluminum nitride.

* * * * *